(12) United States Patent
Zhang et al.

(10) Patent No.: US 11,838,031 B2
(45) Date of Patent: Dec. 5, 2023

(54) DIGITAL-TO-ANALOG CONVERSION CIRCUIT

(71) Applicant: SHANGHAI ANALOGY SEMICONDUCTOR TECHNOLOGY LTD., Shanghai (CN)

(72) Inventors: Jun Zhang, Shanghai (CN); Zhian Zhang, Shanghai (CN)

(73) Assignee: SHANGHAI ANALOGY SEMICONDUCTOR TECHNOLOGY LTD., Shanghai (CN)

( * ) Notice: Subject to any disclaimer, the term of this patent is extended or adjusted under 35 U.S.C. 154(b) by 36 days.

(21) Appl. No.: 17/629,687

(22) PCT Filed: Apr. 30, 2020

(86) PCT No.: PCT/CN2020/088512
§ 371 (c)(1),
(2) Date: Jan. 24, 2022

(87) PCT Pub. No.: WO2021/012747
PCT Pub. Date: Jan. 28, 2021

(65) Prior Publication Data
US 2022/0271772 A1   Aug. 25, 2022

(30) Foreign Application Priority Data
Jul. 25, 2019  (CN) .......................... 201910677660.6

(51) Int. Cl.
*H03M 1/80* (2006.01)
*H03M 1/78* (2006.01)
(Continued)

(52) U.S. Cl.
CPC ......... *H03M 1/808* (2013.01); *H03M 1/1057* (2013.01); *H03M 1/66* (2013.01); *H03M 1/70* (2013.01); *H03M 1/785* (2013.01)

(58) Field of Classification Search
CPC .... H03M 1/808; H03M 1/785; H03M 1/1057; H03M 1/66; H03M 1/70
(Continued)

(56) References Cited

U.S. PATENT DOCUMENTS

| 5,008,676 A | 4/1991 | Kanoh |
| 7,242,338 B2 * | 7/2007 | Jiang .................. H03M 1/0682 341/145 |

(Continued)

FOREIGN PATENT DOCUMENTS

| CN | 102130688 A | 7/2011 |
| CN | 102437733 A | 5/2012 |

(Continued)

OTHER PUBLICATIONS

First Office Action for corresponding Chinese Application No. 201910677660.6 dated Mar. 3, 2021, with English Translation (15 pages).

(Continued)

*Primary Examiner* — Khai M Nguyen
(74) *Attorney, Agent, or Firm* — Harness, Dickey & Pierce, P.L.C.

(57) ABSTRACT

A digital-to-analog conversion circuit, comprising: an R–2R resistive network (10) configured to be connected between an output end and a ground end; an output voltage selection unit (20) configured to be connected between the output end of the R–2R resistive network (10) and a voltage output terminal; an output voltage trimming unit (30), wherein the output voltage trimming unit (30) is provided between a 2R resistor on at least one branch of the R–2R resistive network (10) and the ground end.

9 Claims, 6 Drawing Sheets

(51) Int. Cl.
 *H03M 1/10* (2006.01)
 *H03M 1/66* (2006.01)
 *H03M 1/70* (2006.01)

(58) Field of Classification Search
 USPC .............................. 341/118, 121, 145, 154
 See application file for complete search history.

(56) References Cited

U.S. PATENT DOCUMENTS

| | | | |
|---|---|---|---|
| 7,256,721 B2 * | 8/2007 | Copley | H03M 1/1057 |
| | | | 341/145 |
| 9,136,866 B2 * | 9/2015 | Downey | H03M 1/785 |
| 2014/0232580 A1 | 8/2014 | Gutta et al. | |

FOREIGN PATENT DOCUMENTS

| | | |
|---|---|---|
| CN | 102832946 A | 12/2012 |
| CN | 202713277 U | 1/2013 |
| CN | 104247270 A | 12/2014 |
| CN | 108649949 A | 10/2018 |
| JP | S59165509 A | 9/1984 |
| JP | 2837726 B2 | 12/1998 |

OTHER PUBLICATIONS

Second Office Action for corresponding Chinese Application No. 201910677660.6 dated Aug. 10, 2021, with English Translation (15 pages).
Wang Peng, "Research on design technology of high-precision D / a converter", microprocessor, vol. 37, No. 01, pp. 1-4, Feb. 29, 2016.

* cited by examiner

```
                    ┌─ 40
            ┌───────────────┐
            │               │
         L0 │            D0 │ 0001
            │               │
         L1 │            D1 │ 0011
            │  First decoder│
         L2 │            D2 │ 0111
            │               │
         L3 │            D3 │ 1111
            └───────────────┘
```

Fig. 3

```
                    ┌─ 50
            ┌───────────────┐
        S00 │            D0 │ 0001
            │               │
        S01 │            D1 │ 0010
            │ Second decoder│
        S02 │            D2 │ 0100
            │               │
        S03 │            D3 │ 1000
            └───────────────┘
```

Fig. 4

DIGITAL-TO-ANALOG CONVERSION CIRCUIT

CROSS-REFERENCE TO RELATED APPLICATIONS

This application is a 371 U.S. National Phase of International Application No. PCT/CN2020/088512, filed on Apr. 30, 2020, which claims priority to Chinese Application No. 201910677660.6, filed on Jul. 25, 2019. The entire disclosure of the above application is incorporated herein by reference.

TECHNICAL FIELD

The invention generally relates to the electronic technical field, in particular to a digital-analog conversion circuit.

BACKGROUND

With the rapid development of computer technology, multimedia technology and signal processing technology, advanced electronic systems are constantly emerging Digital-to-analog converter (DAC) will be used in the front end and back end of modern advanced electronic systems.

The existing digital-to-analog converter uses the voltage dividing form of the analog signal to convert the input digital signal into analog signal to output. Generally, in order to improve the output accuracy of the digital-to-analog converter, the number of voltage dividing resistors required by typical voltage divider (such as, resistors string voltage divider and "R–2R" ladder resistive network) increases exponentially with the input digital signal, so that the digital-to-analog converter requires a larger circuit area and the circuit cost is too large, in addition, for some specific applications, for example, the output voltage of digital-to-analog converter only needs to have high accuracy near a certain common-mode voltage, and the existing voltage dividing form will cause great circuit waste.

SUMMARY OF THE INVENTION

The purpose of the application is to provide a digital-analog conversion circuit, which has higher trimming accuracy near a certain common-mode voltage, reduces the required area of the circuit, and reduces the circuit cost.

In order to solve the above problems, the application discloses a digital-analog conversion circuit, comprising:
- an R–2R resistive network configured to be connected between an output terminal and a ground terminal;
- an output voltage selection unit configured to be connected between an output terminal of the R–2R resistive network and the output terminal;
- an output voltage trimming unit, wherein the Output voltage trimming unit is provided between a 2R resistor and the ground terminal on at least one branch of the R–2R resistive network.

In a preferred embodiment, the output voltage selection unit comprises $2^n$ selection resistors connecting in parallel with each other, each selection resistor is connected to a reference voltage or the ground through a single-pole double-throw switch.

In a preferred embodiment, the resistance value of the selection resistor is 2R, and a minimum output voltage of the digital-to-analog conversion circuit is $$V_{outmin} = \frac{1}{2^n + 1} VREF,$$

a maximum output voltage is $$V_{outmax} = \frac{2^n}{2^n + 1} VREF,$$

an output voltage interval is $$V_{outstep} = \frac{1}{2^n + 1} VREF,$$

wherein the VREF is the reference voltage value.

In a preferred embodiment, the resistance value of the selection resistor is Rx, and a minimum output voltage of the digital-to-analog conversion is $$V_{outmin} = \frac{2R \left\| \frac{R_x}{2^n - 1} \right.}{2R \left\| \frac{R_x}{2^n - 1} \right. + R_x} VREF,$$

a maximum output voltage is $$V_{outmax} = \frac{2R}{2R + \frac{R_x}{2^n}} VREF,$$

an output voltage interval is $$V_{outstep} = \frac{V_{outmax} - V_{outmin}}{2^n - 1},$$

wherein the VREF is the reference voltage value.

In a preferred embodiment, the digital-analog conversion circuit digital-analog conversion circuit further comprises a first decoder configured to control $2^n$ single-pole double-throw switches according to input digital signals.

In a preferred embodiment, the output voltage trimming unit comprises $2^k-1$ trimming resistors connected in series, and each node between the trimming resistors is connected to the ground terminal through a control switch.

In a preferred embodiment, the output voltage trimming unit are provided on each low m-order branch, and an equivalent resistance value of the R–2R resistive network and the output voltage trimming unit is $$R_{eq} = 2R + \frac{x}{m * 2^k} R_t,$$

wherein Rt is the trimming resistance value, and $R_t \ll 4R$, x is control switch state of all the trimming resistors, and the value range of x is 0, 1, . . . , $m*2^k - 1$.

In a preferred embodiment, the digital-analog conversion circuit digital-analog conversion circuit further comprises a second decoder configured to control $m*2^k$ control switches according to input digital signals.

In a preferred embodiment, the output voltage trimming unit is provided between the 2R resistor and the ground terminal on each branch of the R–2R resistive network.

In a preferred embodiment, the output voltage trimming unit is connected in series on only low m-order 2R resistance branch of the R–2R resistive network.

Compared with the prior art, the digital-to-analog conversion circuit of the present application has at least the following beneficial effects:

1) The digital-to-analog converter of the present application can realize the selective control of different output common-mode voltages.
2) Compared with the traditional digital-to-analog converter, it can achieve the same output voltage accuracy and requires less digital control bits.
3) Compared with the traditional digital-to-analog converter, the resistance values of the required trimming resistors are all equal, which can greatly reduce the complexity of the circuit and reduce the area cost.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time, Feature E can be combined with feature C technically. Then, the A+B+C+D scheme should not be regarded as already recorded because of the technical infeasibility, and A+B+C+E scheme should be considered as already documented.

BRIEF DESCRIPTION OF THE FIGURES

Non-limiting and non-exhaustive embodiments of the present application are described with reference to the following drawings, where like reference numerals refer to like parts throughout the various views unless otherwise specified.

FIG. 3 shows a schematic diagram of a first decoder in an embodiment of the present application.

FIG. 4 shows a schematic diagram of a second decoder in an embodiment of the present application.

DETAILED DESCRIPTION

Various aspects and examples of the present application will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this detailed description section.

Embodiment I

Figure 1:
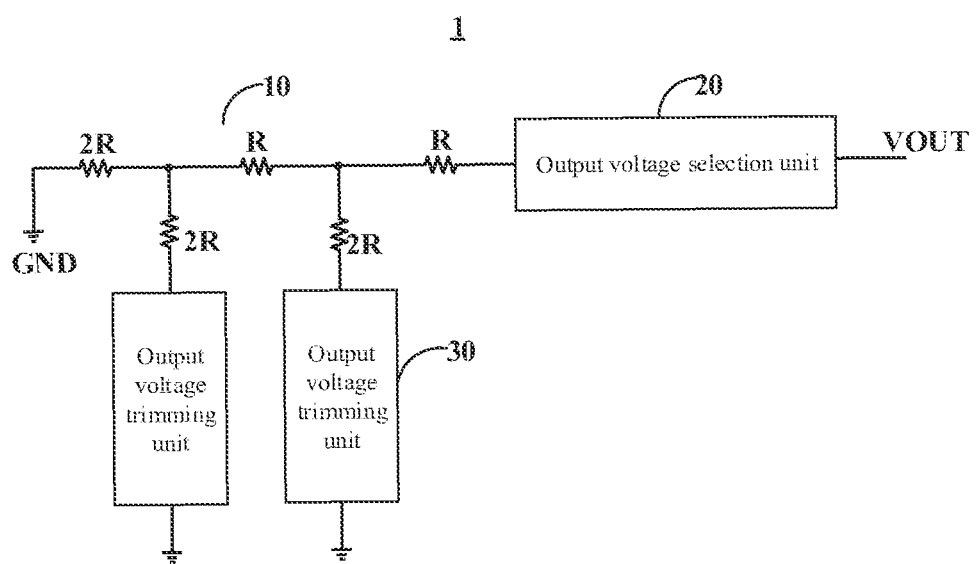
FIG. 1 shows a block diagram of a digital-to-analog conversion circuit in an embodiment of the present application.

FIG. 1 shows a digital-to-analog conversion circuit 1 disclosed in an embodiment of the present application, the digital-to-analog conversion circuit 1 comprises the followings:

an R–2R resistive network 10, the R–2R resistive network 10 is configured to be connected between an output terminal VOUT and a ground terminal GND;

an output voltage selection unit 20, the output voltage selection unit 20 is configured to be connected between an output terminal of the R–2R resistive network 10 and the output terminal VOUT;

an output voltage trimming unit 30, the output voltage trimming unit 30 is configured to be connected between a 2R resistor and the ground terminal GND on at least one branch of the R–2R resistive network 10.

In a preferred embodiment, the output voltage selection unit 20 comprises $2^n$ selection resistors connecting in parallel with each other, each of the selection resistor is connected to a reference voltage or ground through a single-pole double-throw switch.

In a preferred embodiment, the resistance value of the selection resistor is 2R, and a minimum output voltage of the digital-to-analog conversion circuit is $$V_{outmin} = \frac{1}{2^n + 1} VREF,$$

a maximum output voltage is $$V_{outmax} = \frac{2^n}{2^n + 1} VREF,$$

an output voltage interval is $$V_{outstep} = \frac{1}{2^n + 1} VREF,$$

wherein the VREF is the reference voltage value.

In a preferred embodiment, the digital-to-analog conversion circuit further comprises a first decoder configured to control the $2^n$ single-pole double-throw switches according to the input digital signals.

In a preferred embodiment, the output voltage trimming unit comprises $2^k-1$ trimming resistors connected in series, and each node between the trimming resistors is connected to the ground terminal through a control switch.

In a preferred embodiment, the output voltage trimming unit are provided on each low m-order branch, and an equivalent resistance value of the R–2R resistive network and the output voltage trimming unit is $$R_{eq} = 2R + \frac{x}{m*2^k} R_t,$$

wherein Rt is the trimming resistance value, and $R_t \ll 4R$, x is control switch state of all the trimming resistors, and the value range of x is 0, 1, $m*2^k-1$ In a preferred embodiment, the digital-to-analog conversion circuit further comprises a second decoder configured to control $m*2^k$ control switches according to the input digital signals.

In a preferred embodiment, the output voltage trimming unit is provided between the 2R resistor and the ground terminal on each branch of the R–2R resistive network.

Embodiment II

Figure 2:
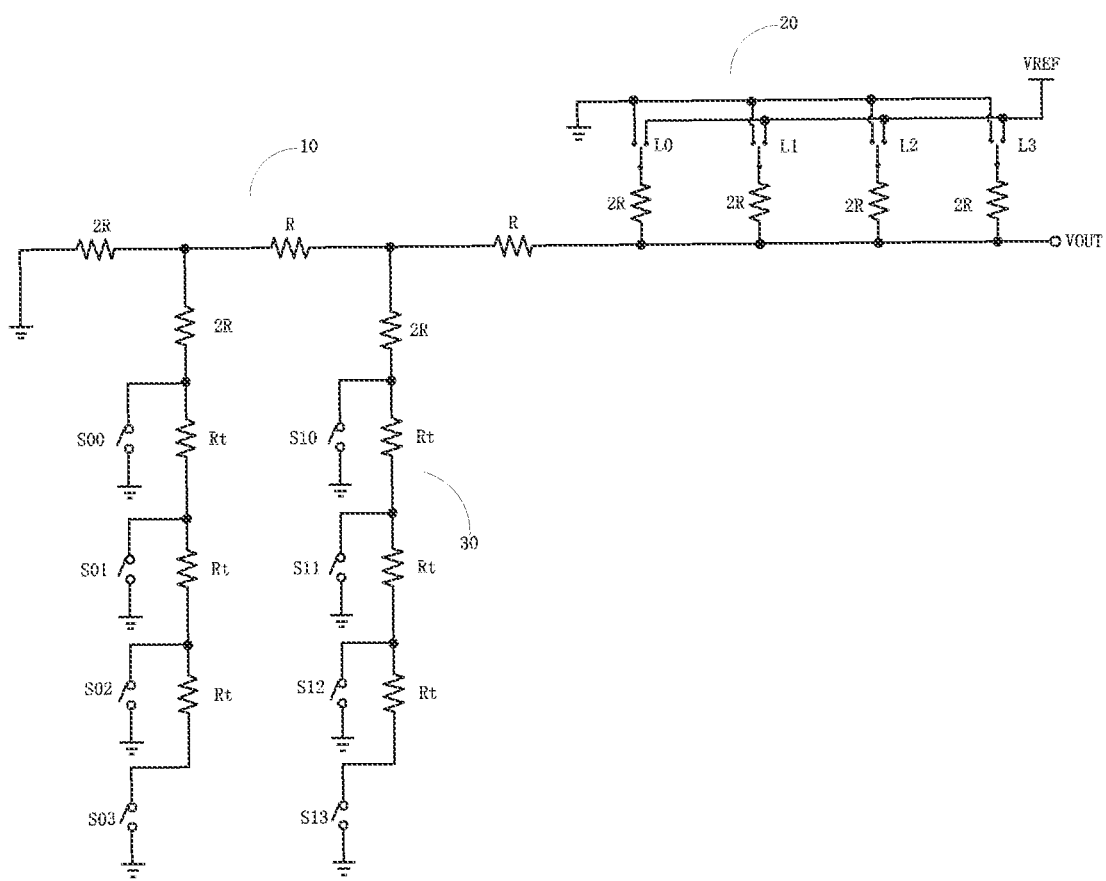
FIG. 2 shows a detailed circuit diagram of a digital-to-analog conversion circuit in an embodiment of the present application.

FIG. 2 shows a more detailed circuit diagram of a digital-to-analog conversion circuit in this embodiment. The output voltage selection unit 20 comprises $2^n$ selection resistors connecting in parallel with each other, wherein n is 2, that is, 4 selection resistors are adopted to form 2-bit digital signal bits, the resistance value of the selection resistor is 2R, and the selection resistors are connected to the reference voltage VREF or the ground terminal GND sequentially through the single-pole double-throw switches L0, L1, L2 and L3.

FIG. 3 shows a schematic diagram of the first decoder 40 in an embodiment of the present application. The first decoder 40 converts the input digital signals D0, D1, D2, D3 into control signals corresponding to the single-pole double-throw switches L0, L1, L2, L3 of the selection unit. If the digital signal of the switching state is "1", it means that one terminal of the selection resistor is connected to the reference voltage VREF, and if the digital signal of the switching state is "0", it means that one terminal of the selection resistor is connected to the grounded GND, In this embodiment, the first decoder 40 realizes 2 bits digital signal control, and the corresponding four switching states are "0001", "0011", "0111" and "1111".

With continued reference to FIG. 2, the R–2R resistive network comprises two 2R resistive branches, each of which is provided with the output voltage trimming unit 30. The voltage trimming unit 30 comprises $2^k-1$ trimming resistors. Specifically, three trimming resistors Rt are provided on each branch, that is, three trimming resistors are adopted on each branch to realize 2 bits digital signal control, and Obits digital control bits are provided on the R–2R resistive network.

FIG. 4 shows a schematic diagram of the second decoder 50 in an embodiment of the present application. The second decoder 50 converts the input digital signals D0, D1, D2, D3 into control signals corresponding to the control switches of the trimming unit on one of the branches, such as control switches S00, S01, S02, S03 on the lowest-order branch. If the digital signal of the control switch state is "1", the corresponding control switch is closed. If the digital signal of the control switch state is "0", the corresponding control switch is switched off. In this embodiment, the second decoder 50 realizes 2 bits digital signal control, and the corresponding four switching states are "0001", "0010", "0100" and "1000". It should be understood that the control switches S10, S11, S12, S13 on the other branch can be controlled using the same digital signals.

The conversion process of the digital-to-analog conversion circuit in the present embodiment is described further below.

Firstly, the influence of the output voltage trimming unit is ignored, that is, all the control switches S00, S01, S02, S03, S10, S11, S12 and S13 are closed and the trimming resistors are short-circuited, and only the influence of the output voltage selection unit on the output voltage is considered.

Taking the digital-to-analog conversion circuit shown in FIG. 2 as an example, the equivalent impedance to the ground "seen" by the output voltage VOUT to the left is the equivalent impedance to the ground of a second-order "R–2R." resistive network, that is, equal to 2R, When the digital signal input by the first decoder is "0001", the output voltage VOUT to the ground terminal (IND is equivalent to four "2R" resistors connected in parallel, and the output voltage VOUT and the reference voltage VRET is equivalent to one "2R" resistor, and the output voltage VOUT is equal to $\frac{1}{5}$*VREF. When the digital signal input by the first decoder is "0011", the output voltage VOUT to the ground terminal GND is equivalent to three "2R" resistors connected g in parallel, and the output voltage VOUT and the reference voltage VREF is equivalent to two "2R" resistors connected in parallel, and the output voltage VOUT is equal to $\frac{2}{5}$*VREF. When the digital signal input by the first decoder is "0111", the output voltage VOUT to the ground terminal GND is equivalent to two "2R" resistors connected in parallel, and the output voltage VOUT and the reference voltage VREF is equivalent to three "2R" resistors connected in parallel, and the output voltage VOUT is equal to $\frac{3}{5}$*VREF. When the digital signal input by the first decoder is "0111", the output voltage VOUT to the ground terminal GND is equivalent to one "2R" resistor, and the output voltage VOUT and the reference voltage VREF is equivalent to four "2R" resistors connected in parallel, and the output voltage VOUT is equal to $\frac{4}{5}$*VREF. In this embodiment, the minimum output voltage is $V_{outmin}=\frac{1}{5}$REF, the maximum output voltage is $V_{outmax}=\frac{4}{5}$REF, the output voltage interval is $V_{outstep}=\frac{1}{5}$VREF.

Furthermore, considering the precise adjustment of the output voltage by the output voltage trimming unit, the trimming unit on each branch comprises four trimming resistors, namely 2 bits digital signal bits, and there are of 4 bit digital signal bits in total on the two branches. Each two bits of the 4 bits digital signal from low to high corresponds to control four switches in series with the "2R" resistors in each branch of the "R–2R" from low to high order.

For the "R–2R" resistive network, if a small trimming resistor "Rt" is connected in series to the "2R" resistor of the lower order (the 0-th order), the equivalent resistance Req "seen" back from the next order (the first order) is:

$$R_{eq} = R + \frac{(2R + R_t) \cdot 2R}{2R + 2R + R_t} \quad (1)$$

simplify to:

$$R_{eq} = 2R + \frac{R_t}{\left(4 + \frac{R_t}{R}\right)} \quad (2)$$

If the value of the trimming resistance Rt satisfies Rt<<4R, then the formula (2) may be approximated as:

$$R_{eq} = 2R + \frac{R_t}{4} \quad (3)$$

It can be seen from the formula (3) that if each "2R" resistor in the m-order "R–2R" resistive network is connected in series with three trimming resistors Rt with the same resistance values, the total equivalent impedance of the "R–2R" resistive network is:

$$R_{eq} = 2R + \frac{x}{2^{2n}} R_t \quad (4)$$

Among them, "x" corresponds to different states of 8 digits, and its values are 0, 1, . . . and 7.

Figure 5:
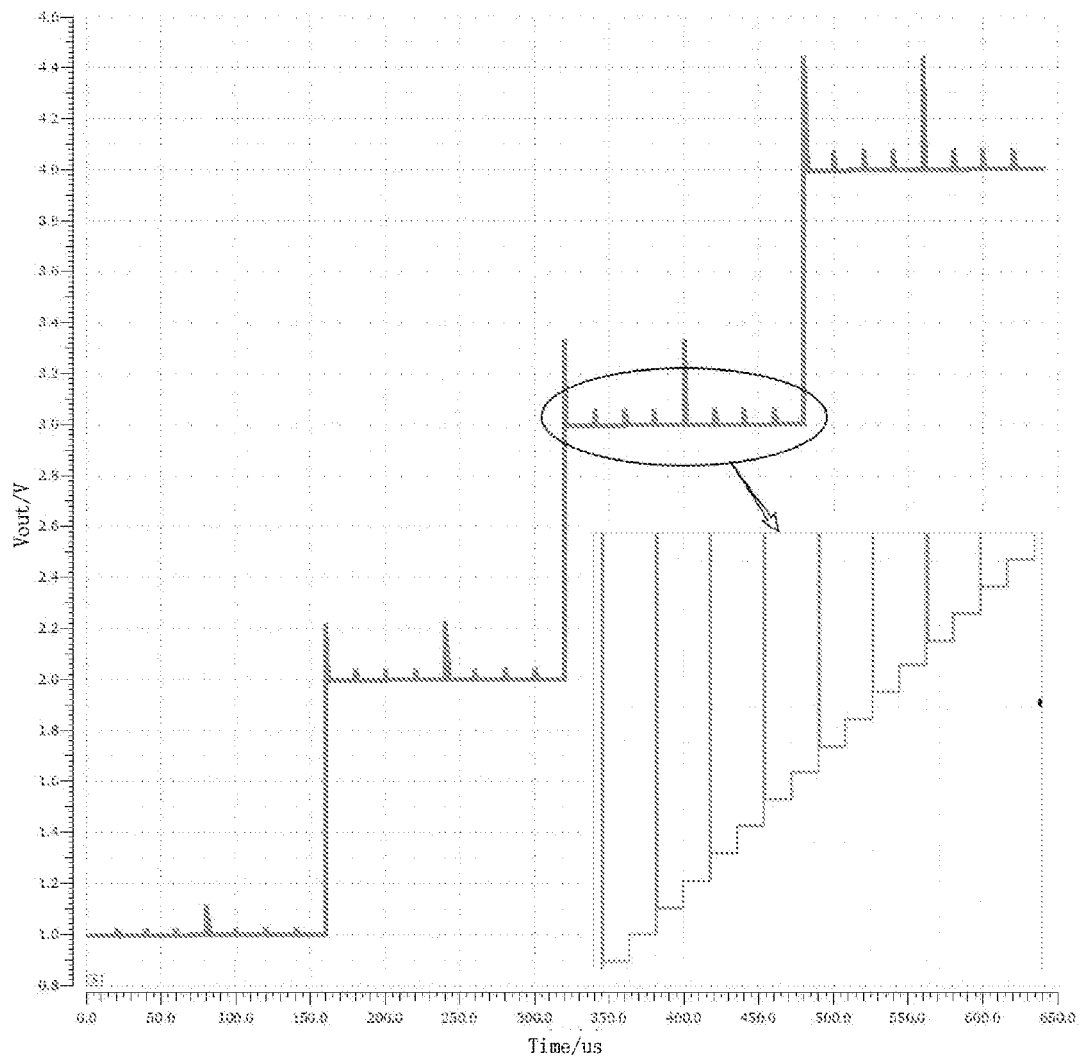
FIG. 5 shows simulation results of output voltages in an embodiment of the present application.

FIG. 5 shows a simulation result of the digital-to-analog conversion circuit shown in FIG. 2. In FIG. 5, the abscissa is time and the ordinate is output voltage VOUT. Among them, VREF=5V, R=50K, Rt=1K. Then, the output common-mode voltage has four states: 1V, 2V, 3V and 4V. When the output common-mode voltage is 3V, the accurate adjustment voltage interval is about 0.37 mV. By contrast, to achieve the same output accuracy with the conventional resistor string DAC, about 13,500 numbers resistors with 1K resistance value connected in series would be required. Generally, the following table lists the advantages and disadvantages of each circuit index of the resistance string DAC, the R–2R resistance network DAC and the DAC in this embodiment.

|  | resistors string | R–2R resistive network | this application |
|---|---|---|---|
| numbers of digits | more | few | very few |
| output accuracy | low | medium | high |
| common-mode voltage | 0 to VREF | 0 to VREF | configurable |
| linearity | very good | medium | poor |
| numbers of resistors | more | few | very few |
| area cost | high | medium | low |

The digital-to-analog converter of the present application can realize the selective control of different output common-mode voltages. Compared with the traditional digital-to-analog converter, it needs less digital control bits to achieve the same output volt age accuracy. Compared with the traditional digital-to-analog converter, the resistance values of the required trimming resistors are equal, which can greatly reduce the circuit complexity and area cost.

Embodiment III

The first and second embodiments disclose multi-digit accurate output trimming DAC structure which performs trimming resistance control on the multi-stage "R–2R" resistive network to realize the trimming accuracy and the trimming range of the output voltage. However, another embodiment of the present application also discloses a DAC structure for high-precision output voltage trimming, which can also achieve higher output voltage trimming accuracy by keeping the total number of digital control bits unchanged and only expanding the "R–2R" resistive network in multiple stages (partial branches).

Figure 6:
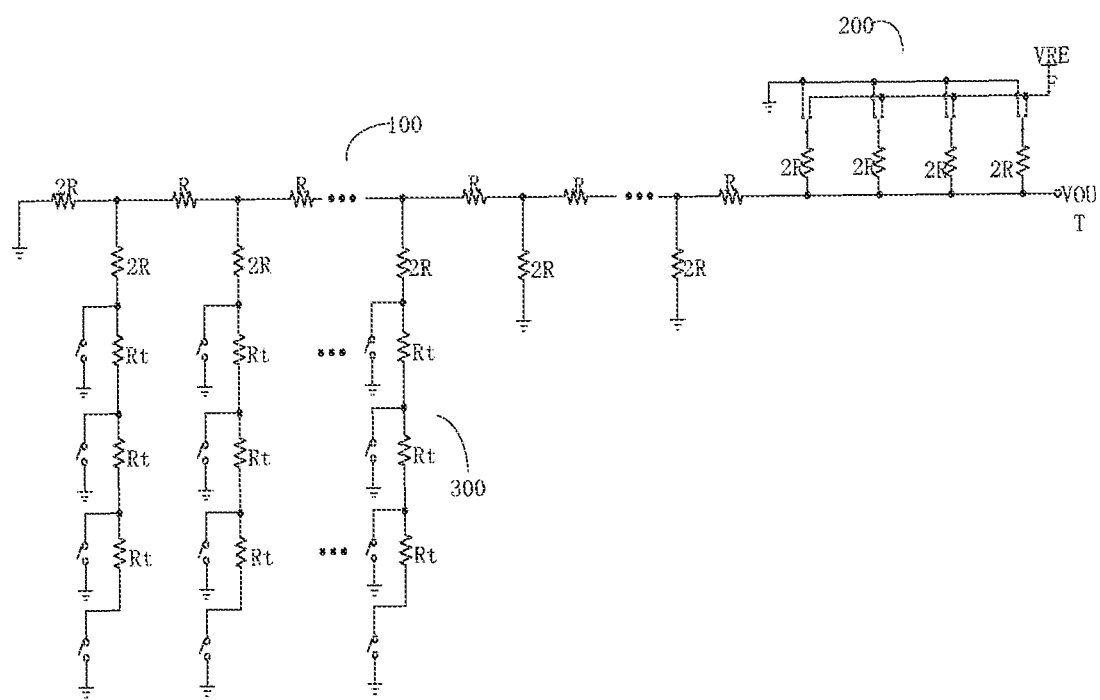
FIG. 6 shows a detailed circuit diagram of a digital-to-analog conversion circuit in another embodiment of the present application.

Referring to FIG. 6, the digital-to-analog conversion circuit comprises an R–2R resistive network 100 configured to be connected between an output terminal VOUT and a ground terminal GND; an output voltage selection unit 200 configured to be connected between an output terminal of the R–2R resistive network 100 and the output terminal VOUT; an output voltage trimming unit 300, the Output voltage trimming unit 300 is configured to be connected between a 2R resistor and the ground terminal GND on at least one branch of the R–2R resistive network 100. Wherein, the output voltage trimming unit is connected in series on only low nn-order 2R resistance branch of the R–2R resistive network, and there are no the output voltage trimming unit connected on higher than m-order 2R resistance branch of the R–2R resistive network, which can ensure the trimming range of the common-mode rejection ratio and realize higher trimming accuracy at the same time.

For example, in order to realize the 6-bit digital control of the –2R resistive network in the first and second embodiments, different implementations can be adopted. For example, the R–2R resistive network comprises three branches, there are three resistors connected in series on each branch, and each branch realizes 2-bit digital control, with a total 6 bits digital control. Alternatively, the R–2R resistive network comprises three branches, there are seven resistors connected in series on the 0-th and 1-st branches, and the 0-th and 1-st branches realize 3 bit digital control, while there are no trimming resistors connected on the 2-nd branch, with a total of 6 bits digital control.

Embodiment VI

Figure 7:
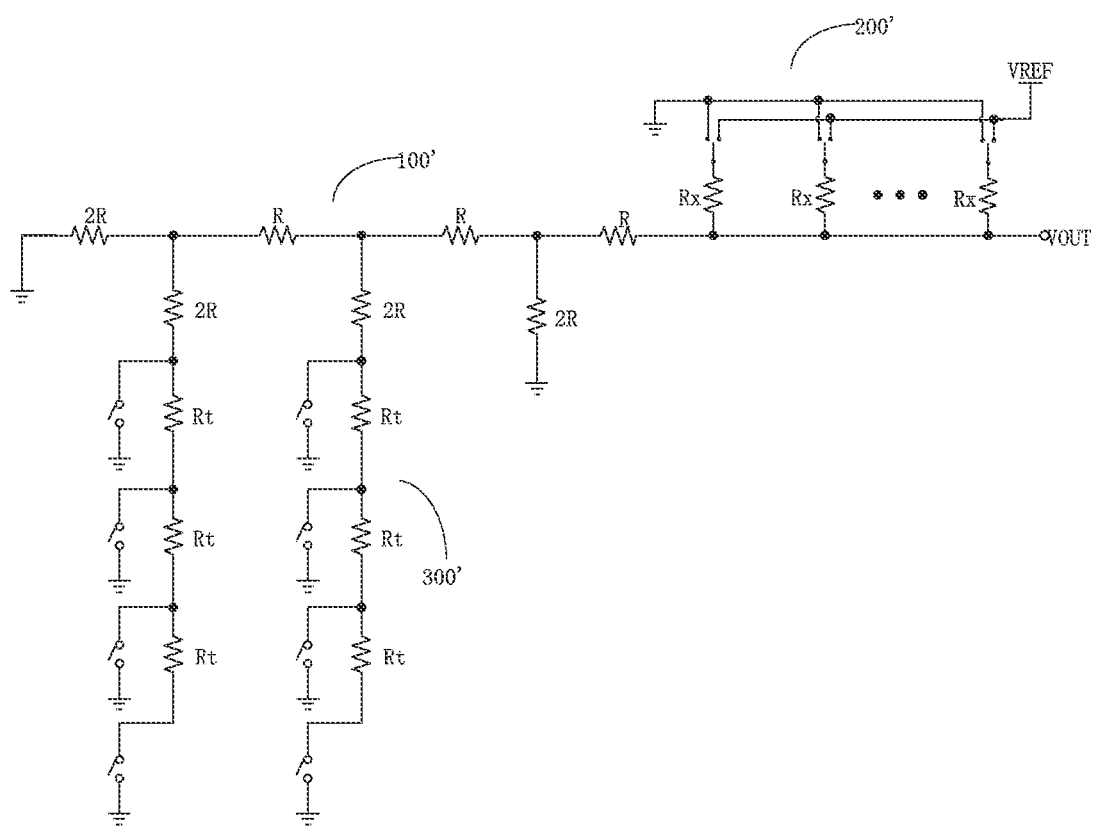
FIG. 7 shows a detailed circuit diagram of a digital-to-analog conversion circuit in another embodiment of the present application.

As shown in FIG. 7, a digital-to-analog conversion circuit of an embodiment of the present application comprises: an R–2R resistive network 100' configured to be connected between the output terminal VOUT and the ground terminal GND; an output voltage selection unit 200' configured to be connected between the output terminal of the R–2R resistive network 100' and the output terminal VOUT, and an output voltage trimming unit 300' configured to be connected between a 2R resistor and the ground terminal GND on at least one branch of the R–2R resistive network 100'. Wherein, the output voltage selection unit is connected in parallel by $2^n$ selection resistors, the resistance value of the selection resistor is Rx, and the digital control of n bits is realized.

Wherein, the minimum output voltage of the digital-analog conversion circuit is $$V_{outmin} = \frac{2R \| \frac{R_x}{2^n - 1}}{2R \| \frac{R_x}{2^n - 1} + R_x} VREF,$$

the maximum output voltage is $$V_{outmax} = \frac{2R}{2R + \frac{R_x}{2^n}} VREF,$$

the output voltage interval is $$V_{outstep} = \frac{V_{outmax} - V_{outmin}}{2^n - 1}.$$

Wherein VREF is the reference voltage value, $$2R \| \frac{R_x}{2^n - 1}$$

represents the resistance value of the 2R resistor in parallel with the $$\frac{R_x}{2^n - 1}$$

resistor, $$2R \| \frac{R_x}{2^n - 1} + R_x$$

represents the resistance value of the 2R resistor in parallel with $$\frac{R_x}{2^n - 1} * Rx$$

resistor.

When the influence of the output voltage trimming unit is ignored, the trimming resistors are all short-circuited, and only the influence of the output voltage selection unit on the output voltage is considered. The equivalent impedance to the ground of the output voltage VOUT "seen" to the left is the equivalent impedance to the ground of a second-order "R–2R" resistive network, that is, equal to 2R. When the first trimming resistor is connected to the reference voltage, the output voltage VOUT to the ground terminal GND is equivalent to $2^n-1$ Rx resistors and one 2R resistor connected in parallel, the output voltage VOUT to reference voltage VREF is equivalent to one Rx resistor, the output voltage is $$V_{out} = \frac{2R \| \frac{R_x}{2^n - 1}}{2R \| \frac{R_x}{2^n - 1} + R_x} VREF.$$

When the first and second trimming resistors are connected to the reference voltage, the output voltage VOUT to the ground terminal GND is equivalent to $2^n-2$ Rx resistors and one 2R resistor connected in parallel, the output voltage VOUT to the reference voltage VREF is equivalent to 21 Rx resistors, the output voltage is $$V_{out} = \frac{2R \| \frac{R_x}{2^n - 2}}{2R \| \frac{R_x}{2^n - 2} + R_x} VREF.$$

When the first, the second and the third trimming resistors are connected to the reference voltage, the output voltage VOUT to the ground terminal GND is equivalent to $2^n-3$ Rx resistors and one 2R resistor connected in parallel, the output voltage VOUT to the reference voltage VREF is equivalent to three Rx resistors, the output voltage $$V_{out} = \frac{2R \| \frac{R_x}{2^n - 3}}{2R \| \frac{R_x}{2^n - 3} + R_x} VREF, \ldots ,$$

and so on, when all $2^n$ trimming resistors are connected to the reference voltage, the output voltage VOUT to the ground terminal GND is equivalent to one 2R resistor, and the output voltage VOUT to the reference voltage VREF is equivalent to $2^n$ Rx resistors, the output voltage is $$V_{out} = \frac{2R}{2R + \frac{R_x}{2^n}} VREF.$$

It should be noted that all or any of the embodiments described above can be combined with each other, unless otherwise stated or such embodiments may be mutually exclusive in terms of functionality and/or architecture.

It should be noted that in the application documents of the present patent, relational terms such as first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In the application file of this patent, if it is mentioned that an action is performed according to an element, it means the meaning of performing the action at least according to the element, and includes two cases: the behaviour is performed only on the basis of the element, and the behaviour is performed based on the element and other elements. Multiple, repeatedly, various, etc., expressions include 2, twice, 2 types, and 2 or more, twice or more, and 2 types or more types.

All documents referred to in this specification are deemed to be incorporated in their entirety in the disclosure of this specification so as to serve as a basis for modifications where necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes described in the drawings do not necessarily require a particular order or successive order shown to achieve the desired results. In some embodiments, multitasking and parallel processing are also possible or may be advantageous.

What is claimed is:

1. A digital-to-analog conversion circuit, comprising:
an R–2R resistive network configured to be connected between an output terminal and a ground terminal;
an output voltage selection unit configured to be connected between an output terminal of the R–2R resistive network and the output terminal;
an output voltage trimming unit, wherein the output voltage trimming unit is provided between a 2R resistor and the ground terminal on at least one branch of the R–2R resistive network the output voltage trimming unit comprises $2^k-1$ series-connected trimming resistors, each end of each trimming resistor is respectively connected to the ground terminal through a control switch, the value of the trimming resistance <<4R, k is a positive integer.

2. The digital-to-analog conversion circuit according to claim 1, wherein the output voltage selection unit comprises $2^n$ selection resistors connecting in parallel with each other, each selection resistor is connected to a reference voltage or the ground through a single-pole double-throw switch, where n is a positive integer.

3. The digital-to-analog conversion circuit according to claim 2, wherein the resistance value of the selection resistor is 2R, and a minimum output voltage of the digital-to-analog conversion circuit is $$V_{outmin} = \frac{1}{2^n+1} VREF,$$

a maximum output voltage is $$V_{outmax} = \frac{2^n}{2^n+1} VREF,$$

an output voltage interval is $$V_{outstep} = \frac{1}{2^n+1} VREF,$$

wherein the VREF is the reference voltage value.

4. The digital-to-analog conversion circuit according to claim 2, wherein the resistance value of the selection resistor is Rx, and a minimum output voltage of the digital-to-analog conversion circuit is $$V_{outmin} = \frac{2R \| \frac{R_x}{2^n-1}}{2R \| \frac{R_x}{2^n-1} + R_x} VREF,$$

a maximum output voltage is $$V_{outmax} = \frac{2R}{2R + \frac{R_x}{2^n}} VREF,$$

an output voltage interval is $$V_{outstep} = \frac{V_{outmax} - V_{outmin}}{2^n - 1},$$

wherein the VREF is the reference voltage value.

5. The digital-to-analog conversion circuit according to claim 2, further comprising: a first decoder, configured to control $2^n$ single-pole double-throw switches according to input digital signals.

6. The digital-analog conversion circuit according to claim 1, wherein the output voltage trimming unit are provided on each low m-order branch, and an equivalent resistance value of the R–2R resistive network and the output voltage trimming unit is $$R_{eq} = 2R + \frac{x}{m*2^k} R_t,$$

wherein hit is the trimming resistance value, and $R_t$<<4R, x is control switch state of all the trimming resistors, and the value range of x is 0, 1, . . . , $m*2^k-1$, where m is a positive integer and x is a non-negative integer.

7. The digital-to-analog conversion circuit according to claim 6, further comprising: a second decoder, configured to control $m*2^k$ control switches according to input digital signals.

8. The digital-analog conversion circuit according to claim 1, wherein the output voltage trimming unit is provided between the 2R resistor and the ground terminal on each branch of the R–2R resistive network.

9. The digital-to-analog conversion circuit according to claim 1, wherein the output voltage trimming unit is connected in series on only low m-order 2R resistance branch of the R–2R resistive network.

* * * * *